United States Patent
Kazama

(10) Patent No.: US 8,653,552 B2
(45) Date of Patent: Feb. 18, 2014

(54) SEMICONDUCTOR LIGHT-EMITTING DEVICE

(71) Applicant: Stanley Electric Co., Ltd., Tokyo (JP)

(72) Inventor: Takuya Kazama, Tokyo (JP)

(73) Assignee: Stanley Electric Co., Ltd., Tokyo (JP)

(*) Notice: Subject to any disclaimer, the term of this patent is extended or adjusted under 35 U.S.C. 154(b) by 0 days.

(21) Appl. No.: 13/774,996

(22) Filed: Feb. 22, 2013

(65) Prior Publication Data

US 2013/0228744 A1  Sep. 5, 2013

(30) Foreign Application Priority Data

Feb. 24, 2012  (JP) .................. 2012-038146
Jul. 25, 2012  (JP) .................. 2012-164824

(51) Int. Cl.
*H01L 33/00* (2010.01)

(52) U.S. Cl.
USPC ............................. 257/98; 257/99; 257/100

(58) Field of Classification Search
USPC .................................... 257/98–100
See application file for complete search history.

(56) References Cited

U.S. PATENT DOCUMENTS

| | | | |
|---|---|---|---|
| 6,995,030 B2 | 2/2006 | Illek et al. | |
| 7,109,527 B2 | 9/2006 | Illek et al. | |
| 8,040,463 B2 | 10/2011 | Kazama | |
| 2002/0017652 A1 | 2/2002 | Illek et al. | |
| 2006/0180820 A1 | 8/2006 | Illek et al. | |
| 2012/0007118 A1* | 1/2012 | Choi et al. | ........ 257/98 |

FOREIGN PATENT DOCUMENTS

| | | |
|---|---|---|
| JP | 2004-297095 A | 10/2004 |
| JP | 2008-282851 A | 11/2008 |
| JP | 2009-010359 A | 1/2009 |
| JP | 4230219 B2 | 2/2009 |
| JP | 2011-165853 A | 8/2011 |

* cited by examiner

*Primary Examiner* — Samuel Gebremariam

(74) *Attorney, Agent, or Firm* — Holtz, Holtz, Goodman & Chick, PC

(57) ABSTRACT

The light-emitting device includes a groove passing through a second semiconductor layer and a light-emitting layer to reach a first semiconductor layer; a first ohmic electrode in contact with the first semiconductor layer within the groove; a connection electrode passing through the first semiconductor layer from the surface thereof and electrically connected to the first ohmic electrode; an insulating layer for covering the second semiconductor layer on a surface thereof opposing the first semiconductor layer, the insulating layer having an opening; a second ohmic electrode in contact with the second semiconductor layer in the opening; a metal layer formed over the insulating layer, and connected to the second ohmic electrode; and a support bonded to the metal layer.

13 Claims, 6 Drawing Sheets

SEMICONDUCTOR LIGHT-EMITTING DEVICE

BACKGROUND OF THE INVENTION

1. Technical Field

The present invention relates to a semiconductor light-emitting device, and in particular, to a light-emitting diode (LED) formed by bonding a semiconductor light-emitting layer, which has been grown on a growth substrate, to a support substrate, and then removing the growth substrate.

2. Description of the Related Art

In the past, an LED (having a metal bonding (MB) structure) constituted by bonding of a semiconductor light-emitting layered structure grown on a growth substrate (or a temporary substrate) by a vapor phase growth method such as metal-organic chemical vapor deposition (MOCVD) to a conductive support substrate (or a permanent substrate) with a reflective mirror therebetween, and then removing the growth substrate, has been disclosed, for example, in Japanese Laid-Open Patent Application 2009-10359 (hereinafter, referred to as Patent Document 1). The reflecting mirror is provided to the opposite side from the light-extraction surface, to improve light-extraction output to the outside.

In an LED of the aforementioned bonding structure, the thickness of the semiconductor layers is thinner in comparison to chip size, as compared with an LED fabricated on a conductive growth substrate; and as current spread is predominantly in the horizontal direction (i.e., in-plane direction), it is therefore difficult for the current to spread. The light-emission efficiency of an LED is dependent upon the current density injected into the active layer. When the current density is high, the carriers injected into the active layer overflow, thereby reducing the number of carriers that contribute to light emission, creating the problem of diminished light-emission efficiency and a fall in the linearity of light-emission output with respect to current. An additional problem in terms of reliability arises in that localized current concentrations cause propagation of crystal defects due to electrical field concentrations, heat generation, and the like.

A configuration adopting a so-called counter electrode configuration, which has no overlap between the electrode on the light-extraction surface side and the electrode on the reflecting surface side in top view, in order to facilitate current spread in the horizontal direction, has also been disclosed (for example, Japanese Laid-Open Patent Application 2008-282851 (hereinafter Patent Document 2) or Japanese Laid-Open Patent Application 2011-165853 (hereinafter Patent Document 3).

Additionally, in Japanese Patent Publication 4230219 (hereinafter Patent Document 4), for example, there is disclosed a semiconductor light-emitting device in which mesas are formed on the semiconductor layer, utilizing reflection at the side surfaces of the mesas to improve the light-extraction efficiency. Additionally, Japanese Laid-Open Patent Application 2004-297095 (hereinafter Patent Document 5) discloses an electrode configuration of an element having an insulating substrate.

SUMMARY OF THE INVENTION

However, in light-emitting devices such those described above, the light emitted from the light-emitting layer is shielded by the electrodes disposed at the light-extraction surface side, thus reducing light output.

With the foregoing in view, it is an object of the present invention to provide a semiconductor light-emitting device having improved light-extraction efficiency from the light-extraction surface. A further object is to provide a semiconductor light-emitting device having improved in-plane current spread, a low level of carrier overflow, high light-emission efficiency, and high linearity of light output, and that is moreover highly reliable, with less or negligible deterioration.

According to the present invention, there is provided a light-emitting device having a semiconductor structure layer in which there are sequentially stacked a first semiconductor layer, a light-emitting layer, and a second semiconductor layer of the opposite conduction type to the first semiconductor layer, a surface of the first semiconductor layer serving as a light-extraction surface, the light-emitting device having:

a groove passing through the second semiconductor layer and the light-emitting layer from the second semiconductor layer side, to reach the first semiconductor layer;

a first ohmic electrode formed so as to be in contact with the first semiconductor layer within the groove;

a connection electrode passing through the first semiconductor layer from the surface of the first semiconductor layer, and electrically connected to a portion of the first ohmic electrode;

an insulating layer for covering the second semiconductor layer on a surface thereof opposing the first semiconductor layer, the insulating layer having an opening through which an opposing surface is partially exposed;

a second ohmic electrode formed so as to be in contact with the second semiconductor layer in the opening;

a metal layer formed over the insulating layer, and connected to the second ohmic electrode; and a support bonded to the metal layer via a bonding layer.

DETAILED DESCRIPTION OF THE INVENTION

To facilitate description and understanding, in the embodiments described hereinbelow, a case in which the semiconductor structure layer comprises a first semiconductor layer, a light-emitting layer, and a second semiconductor layer, the first semiconductor layer being an n-clad layer, and the second semiconductor layer comprising a p-clad layer and a p-contact layer, is described; however, there is no limitation to such a configuration. Specifically, the first semiconductor layer and/or the second semiconductor layer, as well as the light-emitting layer, respectively, may be configured by a plurality of layers. For example, the semiconductor layer may include a carrier injection layer, a barrier layer for preventing carrier overflow, a current spread layer, a contact layer for improving ohmic contact, a buffer layer, and the like. Alternatively, the second semiconductor layer may be configured by a single layer. Further, the conduction types of the first semiconductor layer and the second semiconductor layer may respectively be opposite from those in the following embodiments.

While the present invention is described below in terms of the presently preferred embodiments, appropriate modifications or combinations thereof are possible. In the following description and the appended drawings, parts which are substantially identical or equivalent have been assigned identical reference symbols in the description.

First Embodiment

Figure 1:
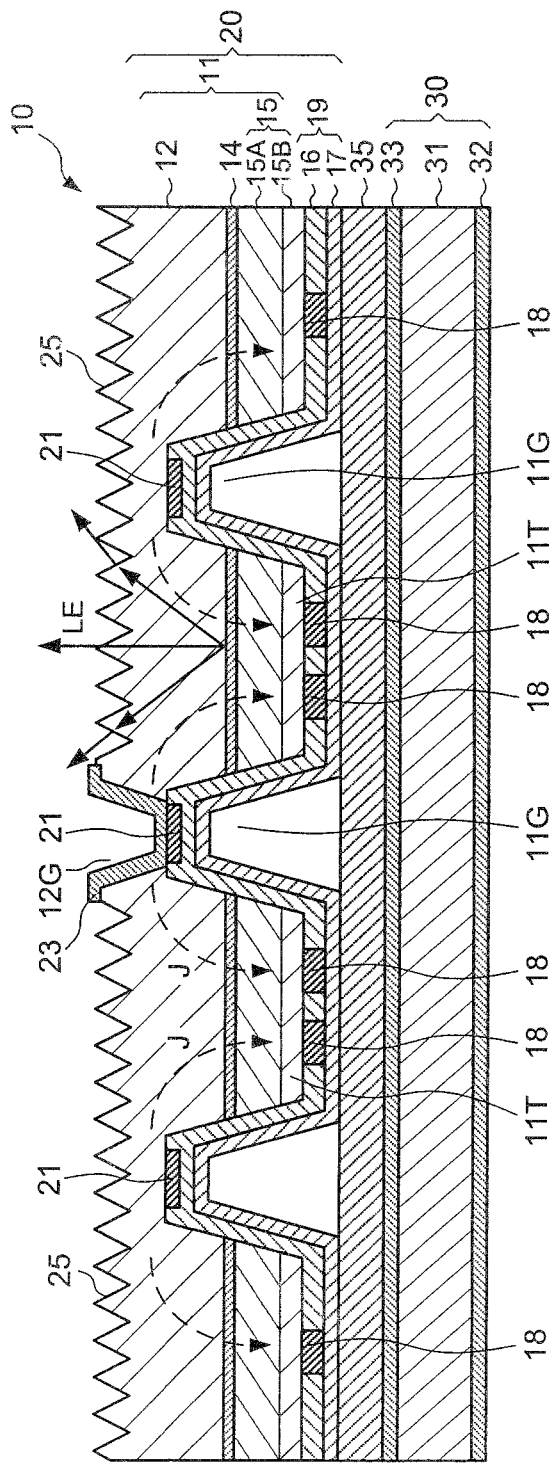
FIG. 1 is a sectional view schematically showing the light-emitting device according to a first embodiment of the present invention.

FIG. 1 is a sectional view schematically showing the light-emitting device 10 according to a first embodiment of the invention. The light-emitting device 10 is an AlGaInP light-emitting diode (LED) having a structure in which a light-emitting element structure 20 and a support 30 are joined via a joining layer or bonding layer 35.

In further detail, the light-emitting element structure (hereinafter, simply referred to as the element structure) 20 has a semiconductor structure layer 11 which is a light-emitting functional layer comprising a first semiconductor layer 12 of a first conduction type, a light-emitting layer 14, a second semiconductor layer 15 of a second conduction type that is the opposite conduction type to the first conduction type. In the present embodiment, the first semiconductor layer 12 is an n-type semiconductor layer, and the second semiconductor layer 15 is a p-type semiconductor layer.

An insulating layer 16 comprising $SiO_2$, SiN, or the like is formed over the second semiconductor layer 15, and a metal layer 17 comprising a metal of high optical reflectance, such as Ag, is formed over the insulating layer 16. A reflecting layer 19 for reflecting the light from the light-emitting layer 14 is configured by the stacked or layered structure of the insulating layer 16 and the metal layer 17.

Herein, a light-emitting functional layer indicates a layer configured by semiconductors that have been included for their light-emitting functionality, and refers to a semiconductor structure layer configured by a stacked or layered structure of an n-type semiconductor layer, a light-emitting layer (or active layer), and a p-type semiconductor layer, or the like, that gives rise to light-emitting action through recombination of the injected carriers.

In the semiconductor structure layer 11 there are formed a plurality of grooves 11G penetrating or passing through the light-emitting layer 14 and reaching to the first semiconductor layer (i.e., the n-clad layer) 12 from the second semiconductor layer (i.e., the p-clad layer 15A and the contact layer 15B). The surfaces of the semiconductor structure layer 11 exposed to the grooves 11G are then covered by the insulating layer 16 and the metal layer 17. The insulating layer 16 should be formed in such a manner to provide insulation to portions of the light-emitting layer 14 penetrated through by formation of the grooves 11G.

Additionally, the insulating layer 16 is provided with openings that partially expose the p-contact layer 15B surface, i.e., the surface opposing the surface of the n-clad layer 12, and is further provided with p-electrodes 18, provided within the openings, for forming ohmic contact with the p-contact layer 15B, and electrically connected to the metal layer 17. There are provided, within the grooves 11G, n-electrodes 21 that have formed ohmic contact with the n-clad layer 12. The n-electrodes 21 are provided at the bottom in each of the plurality of grooves 11G, for example. Furthermore, a through-hole 12G is formed reaching down onto the n-electrode 21 from the surface of the n-clad layer 12. A connection electrode 23 reaching to the n-electrode 21 from the surface of the n-clad layer 12 and connected to the n-electrode 21 is formed in the through-hole 12G.

There is formed a light-extraction structure 25 having asperities or recesses/projections on the surface of the n-clad layer 12, i.e., the light-extraction surface. The disposition of the recessed portions and projected portions of the light-extraction structure 25 may be random or periodic. The recesses and projections can be configured by protrusions of conical shape or pillar shape, depressions, or the like. High light-extraction effect is obtained where the recesses and projections have size (dimension or periodicity: A) within the range $1.0\lambda 0/n \le A \le 10.0\lambda 0/n$, and height (B) within the range $0.5A \le B \le 1.5A$. $\lambda 0$ denotes a light-emission wavelength in a vacuum, and "n" denotes the refractive index of semiconductor layer with respect to the light-emission wavelength. For an AlGaInP material, for example, $\lambda 0=625$ nanometers (nm), $n=3.3$, and the size A is about 200-2000 nm.

As shown in FIG. 1, a support 30 has a conductive support substrate 31, an ohmic electrode 32 formed over one of the principal surfaces of the support substrate 31 (i.e., the back surface of the light-emitting device 10), and an ohmic electrode 33 formed over the other principal surface, and is joined to the element structure 20 by a bonding layer 35 which is a metal layer formed over the ohmic electrode 33.

Figure 2A:
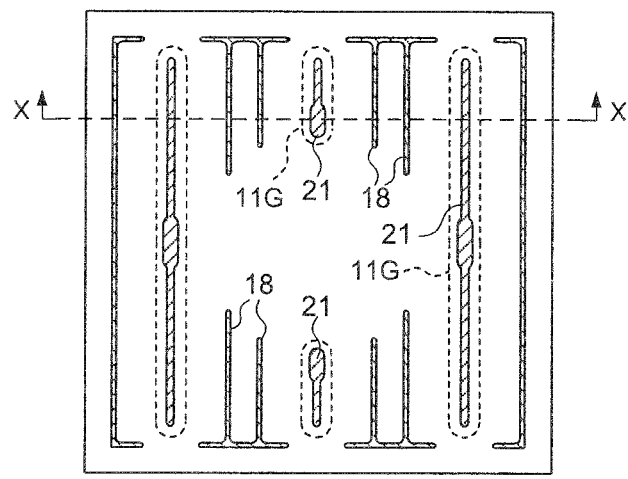
FIGS. 2A, 2B, and 2C are plan views schematically showing the electrode configuration of the light-emitting device of the first embodiment.
Figure 2B:
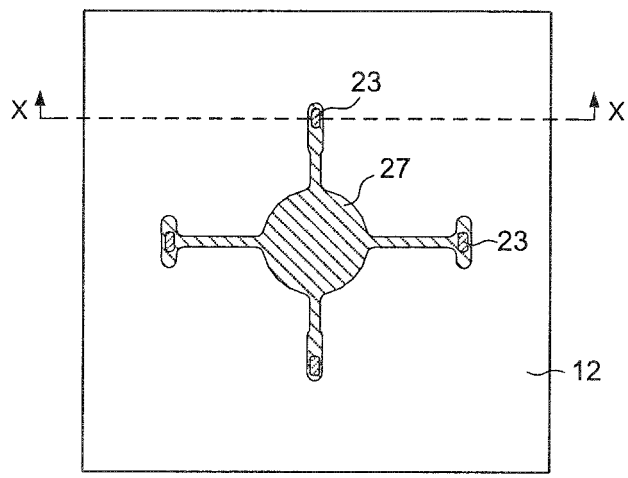
Figure 2C:
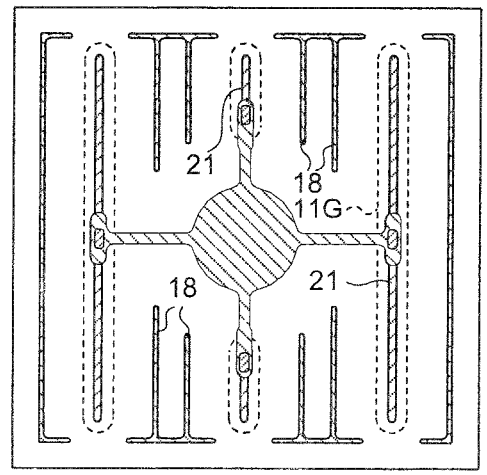

FIGS. 2A, 2B, and 2C are plan views schematically showing the electrode configuration of the light-emitting device 10 of the first embodiment. In further detail, FIG. 2A schematically shows the electrode configuration where the p-electrodes 18 and the n-electrodes 21 of the light-emitting device 10 are projected onto a plane parallel to the crystal growth plane (or to the semiconductor structure layer 11). FIG. 1 is a sectional view taken along line X-X in FIGS. 2A and 2B.

As shown in FIG. 2A, the n-electrodes 21, which are ohmic electrodes for the n-clad layer 12, and the p-electrodes 18, which are ohmic electrodes for the p-contact layer 15B, are disposed such that there is no overlap thereof in the projection plane, specifically, in top view seen in a direction perpendicular to the surface of the n-clad layer 12, i.e., the light-extraction surface. The p-electrodes 18 and the n-electrodes 21 constitute electrodes in a so-called counter disposition.

FIG. 2B schematically shows an n-pad electrode (or wiring electrode) 27 formed on the connection electrodes 23 and the light-extraction surface (i.e., the surface of the n-clad layer 12). FIG. 2C schematically shows electrode configuration where the p-electrodes 18, the n-electrodes 21, the connection electrodes 23 and the n-pad electrode 27 are projected onto a plane parallel to the semiconductor structure layer 11. Specifically, the drawing is a synthesis of FIG. 2A and FIG. 2B. As mentioned previously, the n-electrodes 21, which are ohmic electrodes, are electrically connected to the connection electrodes 23, with the individual connection electrodes 23 being connected to the n-pad electrode 27. The n-pad electrode 27 is formed as a Schottky electrode for the n-clad layer 12, and the n-pad electrode 27 is powered by a power feed wire connected thereto from the outside.

The ohmic electrode 32, which is a p-electrode, is connected to the p-electrodes 18 via the conductive support substrate 31, the ohmic electrode 33, the bonding layer 35 which is a metal layer, and the metal layer 17 constituting the reflecting layer.

Specifically, as shown in FIG. 1 and FIGS. 2A, 2B, and 2C, in the first embodiment, the plurality of grooves 11G having linear shape are formed in the semiconductor structure layer 11, and in each of these are formed a linear n-electrode 21, and linear p-electrode 18 parallel to the n-electrode 21. Each individual one of the plurality of n-electrodes 21 is provided with a connection electrode 23 connected to a portion thereof. The plurality of connection electrodes 23 are connected to the n-pad electrode 27 formed on the n-clad layer 12.

Whereas an instance in which the grooves 11G, the n-electrodes 21, and the p-electrodes 18 are formed to have a linear shape is shown by way of example, other configurations, for example, a concentric circular configuration, are possible as well. Because the connection electrodes 23 are electrodes for connecting the n-electrodes 21 provided in the interior of the n-clad layer 12 to the wiring electrode (or pad electrode 27) on the light-extraction surface, these may be provided so as to be connected to a portion of the n-electrodes 21 as shown in FIG. 2B, and, in particular, are preferably small in size so as not to affect light extraction.

Consequently, when voltage is applied to the ohmic electrode 32, which is a p-electrode, and to the n-pad electrode 27 which is a Schottky electrode, current flows between the p-electrodes 18 and the n-electrodes 21, and the light-emitting layer 14 emits light. In FIG. 1, the paths of current (i.e., flows of electrons) J from the n-electrodes 21 to the p-electrodes 18 is shown schematically by broken-line arrows. Because the n-electrodes 21 are provided within the grooves 11G (at the bottom), while the p-electrodes 18 are provided on the contact layer 15B in sections other than the grooves 11G, the electrodes of the light-emitting device 10 have a so-called counter electrode configuration (i.e., the n-electrodes 21 and the p-electrodes 18 do not overlap in top view), and efficient current spread can be performed in in-plane directions of the semiconductor layers, by electrodes having small coverage (i.e., surface coverage) on the light-extraction surface.

According to the present embodiment as described above, the grooves 11G formed in the light-emitting element structure 20 penetrate through the second semiconductor layer (i.e., the contact layer and the p-clad layer) 15 and the light-emitting layer 14 from the reflecting layer 19 side, reaching the first semiconductor layer (i.e., n-clad layer) 12. The ohmic electrodes of the first conduction type (i.e., n-electrodes) 21 are formed at the bottom of the grooves 11G (or, at sections contacting the first clad layer), while the ohmic electrodes of the second conduction type (i.e., p-electrodes) 18 are formed on terraces 11T which are plateaued sections of the second semiconductor layer, other than the sections where the grooves 11G are formed. Specifically, the light-emitting layer 14 is removed in regions where the grooves 11G are formed, and the n-electrodes 21 are formed within the n-clad layer 12. Stated another way, because the light-emitting layer 14 and the p-clad layer 15 towards the reflecting layer 19 side from the n-electrodes 21 (which are the electrodes on the light-extraction surface side) have been removed, the light emitted from the light-emitting layer 14 can be extracted without the light being shielded or blocked by the n-electrodes 21, which are the electrodes on the light-extraction surface side.

[Light-Emitting Device Production Method]

Figure 3:
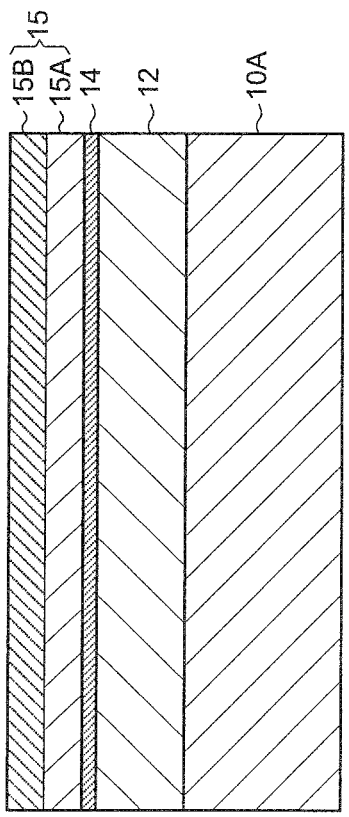
FIG. 3 is a sectional view schematically showing the semiconductor structure layer of the light-emitting device of the first embodiment.

The method of producing the light-emitting device 10 according to the first embodiment is described in detail below, for an AlGaInP light-emitting diode (LED) as an example. FIG. 3 is a sectional view schematically showing the semiconductor structure layer 11 of the light-emitting device 10 of the first embodiment.

Crystal growth was performed employing metal-organic chemical vapor deposition (MOCVD). An n-type GaAs substrate having an off-angle of 15° was employed as a growth substrate 10A. In further detail, on the (100) plane of the GaAs growth substrate 10A, an n-clad layer (($Al_zGa_{1-z}$)$_{0.5}In_{0.5}P$ layer) 12 that was 4 micrometers (μm) thick, a light-emitting layer 14 that was 0.5 μm thick, a p-clad layer 15A that was 1.0 μm thick having the composition ($Al_zGa_{1-z}$)$_{0.5}In_{0.5}P$, and a p-contact layer 15B that was 1.5 μm thick having the composition $Ga_{1-x}In_xP$ (x=0.1), were epitaxially grown in succession in the stated order. A specified condition was that the composition "x" of the $Ga_{1-x}In_xP$ contact layer 15B does not absorb the emitted light from the light-emitting layer 14. The carrier concentration of the n-clad layer 12 was $2\times10^{18}$ cm$^{-3}$ (hereinafter, in some cases exponential denotation, such as 2E18 cm$^{-3}$, is used), and the carrier concentration of the p-clad layer 15A was $2\times10^{18}$ cm$^{-3}$.

The light-emitting layer 14 may be a multiple quantum well (MQW), a single quantum well (SQW), or a single layer (so-called a bulk layer). For example, a multiple quantum well may be constituted from 15 pairs of well layers and barrier layers, with the well layers being ($Al_zGa_{1-z}$)$_{0.5}In_{0.5}P$ layers (composition z=0.10, thickness 20 nm), and the barrier layers being ($Al_zGa_{1-z}$)$_{0.5}In_{0.5}P$ layers (composition z=0.56, thickness 10 nm). The Al composition "z" of the well layers is adjusted within the range $0 \leq z \leq 0.4$, according to the light-emission wavelength. The Al composition "z" of the n-clad layer 12 and the p-clad layer 15A is adjusted within the range $0.4 \leq z \leq 1.0$.

The total thickness of the semiconductor structure layer 11 was 7.0 μm. The n-clad layer 12, the light-emitting layer 14, the p-clad layer 15A, and the p-contact layer 15B are lattice-matched to the GaAs substrate.

[Formation of Grooves for n-Electrodes]

Next, the grooves 11G for the n-electrodes are formed by photolithography and dry etching. In further detail, the p-contact layer 15B, the p-clad layer 15A, the light-emitting layer 14, and the n-clad layer 12 are removed by dry etching. The etching depth of the n-clad layer 12 was 2.0 μm, versus the 4.0 μm thickness of the n-clad layer 12, forming grooves of 5.0 μm (total etching amount). In the case of an AlGaInP material, typically, 0.5 μm is needed for the clad layers on the p-side and the n-side, respectively, for the purpose of electron confinement; and 0.5 μm is needed for the light-emitting layer 14. Therefore, in the case of this layer structure, by forming the grooves to a depth of 1.5 μm or more, there can be formed grooves 11G that penetrate through the second semiconductor layer (i.e., the p-contact layer 15B and the p-clad layer 15A) and the light-emitting layer 14 to reach the first semiconductor layer (i.e., n-clad layer) 12. In the case of the present embodiment, the width of the n-electrodes 21 is 5.0 μm, and the width of the grooves 11G is 20 μm. In preferred practice, because narrower width means that the removed width of the light-emitting 14 is smaller, the etching width of the grooves is preferably small. In the case of the present embodiment, no rise in forward voltage was observed when the depth of the grooves formed in the n-clad layer 12 by the grooves 11G was 2.0 μm or more.

[Formation of n-Electrodes]

The n-electrodes 21, which are ohmic electrodes, are formed at the positions for electrode formation in the grooves 11G, for example, at the bottom. The n-electrodes 21 are formed through deposition of metal onto the bottom of the grooves 11G from the p-clad layer 15A side. Employing AuGeNi as the material for forming ohmic contact with the n-type semiconductor, the coverage with respect to the element surface area (specifically, the light-emission surface area) is 5%. While AuGeNi was employed as the material able to form ohmic contact with an n-type semiconductor, it would be possible to employ some other material, such as AuGe, AuSn, AuSnNi, or the like, to form the n-electrodes 21. As an n-ohmic material of an AlGaInP semiconductor, AuGeNi is a representative material affording low-resistive contact, but requires heat treatment at 400° C. or above, and when heat treatment is performed, an alloy layer that absorbs the light of the light-emitting layer is formed. However, according to the configuration of the present embodiment, the n-electrodes 21 are disposed at positions such that the light from the light-emitting layer is not blocked, and it is therefore possible to avoid absorption by this alloy layer.

[Formation of Insulating Film]

Next, the insulating layer 16 is formed in order to insulate the junction of the semiconductor structure layer 11, and to insulate the n-electrodes 21. $SiO_2$ was employed for the insulating layer 16, and the layer thickness was 320 nm. The insulating material for the insulating layer 16 is not limited to $SiO_2$; SiN, $TiO_2$, $Al_2O_3$, or the like can be used as well. Together with the metal layer, discussed later, the insulating layer 16 serves as a reflecting layer. Therefore, the layer thickness "d" of the $SiO_2$ layer, with respect to the light emission wavelength λ0 in a vacuum, is constituted as d=λ0/(4n)×m (where n is the refractive index of $SiO_2$, and m is an integer). Here, λ0=625 nm, n=1.45, and m=3.0, so a value of d=320 nm is employed.

[Formation of p-Electrodes]

Firstly, the $SiO_2$ of the insulating layer 16 is patterned to the desired shape by photolithography and etching employing buffered hydrofluoric acid (BHF), to create openings in the insulating layer 16 and expose the p-contact layer 15B. Either wet etching or dry etching may be performed. Thereafter, the p-electrodes 18, which are ohmic electrodes, are formed on the reflecting layer side. The p-electrodes 18 are deposited to a thickness of 320 nm, by sputtering with AuZn, which is a metal capable of forming ohmic contact. Thereafter, under a nitrogen atmosphere, heat treatment is performed at approximately 400° C. Through this alloying process, good ohmic contact is formed in the n-electrodes 21 at the bottom of the grooves 11G, and in the p-electrodes 18 in the openings of the $SiO_2$ insulating layer 16. The timing of the alloying process for forming ohmic contact preferably comes prior to formation of the reflecting metal layer and the barrier layer on the insulating layer 16. This is to reduce the likelihood of generating shorts or leaks in the p-n junction portion exposed by formation of the grooves.

[Formation of Reflecting Metal Layer and Barrier Layer]

Next, a 300 nm layer of gold (Au) is formed as the reflecting metal layer 17. Other materials, such as Al, Ag, or the like, having high reflectance of light from the light-emitting layer 14 can be employed as the reflecting metal layer 17 as well. The reflecting metal layer 17 and the $SiO_2$ insulating layer 16 constitute the reflecting layer 19. Of the light radiated from the light-emitting layer 14, the light traveling towards the opposite side from the light-extraction side is reflected by the reflecting layer 19, thus improving the light-extraction efficiency.

Next, the barrier layer (not illustrated) is formed over the reflecting metal layer 17. In more specific terms, TaN, TiW, and TaN are sequentially stacked by sputtering. The thickness of the respective films is 100 nm, for example. The barrier layer can be formed from a single layer or a multilayer film of a high-melting point metal such as Ta, Ti, and W, or nitrides thereof (TaN or the like). Besides sputtering, electron beam (EB) vapor deposition may be employed. The barrier layer prevents infiltration (or diffusion) of the eutectic material to the reflecting electrode layer side in subsequent steps, while at the same time preventing outward diffusion of the Zn in the AuZn. Absent the function of this barrier layer, the effects of heat in subsequent steps may give rise to deterioration in electrical characteristics, such as increase of forward voltage (Vf) or the like, or to diminished luminance due to diminished reflectance.

Thereafter, an adhesion layer is formed by EB vapor deposition. Here, Ni and Au are employed to give films 300 nm and 30 nm thick, respectively. Vapor deposition may be accomplished by resistance heating vapor deposition, or by sputtering. The purpose of the adhesion layer is to improve the wettability to the eutectic bonding layer of a conductive support substrate 30 (discussed below) in a step for thermocompression bonding of the semiconductor layer and the conductive support substrate (discussed below), so as to form a good joint.

[Bonding to the Support]

The ohmic metal layer 32 is vapor-deposited on one surface of the conductive substrate (Si substrate) 31, while on the other surface, the ohmic metal layer 33, a joining layer, an adhesion layer, and a eutectic bonding layer are vapor-deposited in succession, to form the conductive support substrate 30. A silicon (Si) substrate doped with a high concentration of a p-type impurity can be employed as the conductive support substrate 31, and platinum (Pt) as the ohmic metal layer, for example. Film thickness of the ohmic metal layer (Pt) may be 100 to 300 μm for example; here, 200 nm is selected. While ohmic characteristics may be obtained in the aforementioned combination simply by vapor deposition of an ohmic metal layer, adhesion to the conductive substrate is improved through heating in steps such as thermocompression bonding, discussed below. For the ohmic metal layer, it is possible to employ, besides Pt, other metals capable of forming ohmic contact with the Si substrate, such as Au, Ni, Ti, or the like. In this case, an alloying step carried out under a nitrogen atmosphere may be necessary, as appropriate, in order to obtain ohmic contact with the Si substrate. The substrate is not limited to an Si substrate; other conductive materials having high thermal conductivity, such as Ge, Al, Cu, or the like, may be employed as well.

The joining layer and the adhesion layer are films of Ti and Ni, for example, with respective film thickness of 100 to 200 nm and 50 to 150 nm. Here, a film thickness of 150 nm for Ti and a film thickness of 100 nm for Ni have been selected. For a wetting improvement layer, NiV, Pt, or the like may be used in place of Ni. Furnishing these layers increases the reliability of adhesion of the conductive substrate, as well as improving wettability in the step of thermocompression bonding to the semiconductor layer, preventing ball-up of the AuSn layer.

For the eutectic bonding layer, AuSn in a film thickness of 300 to 3000 nm, for example, is employed. In preferred practice, the composition Au:Sn is approximately 80 wt %:approximately 20 wt % (approximately 70 at %:approximately 30%). Here, the film thickness of the eutectic bonding layer is 600 nm, with the aforementioned composition selected as the AuSn composition. Provided that AuSn is the principal component in the eutectic bonding layer, an adjuvant may be added to the AuSn, for example. For the vapor deposition method, an appropriate procedure selected from resistance heating and EB vapor deposition, sputtering, and the like, can be employed.

The element structure 20 and the conductive substrate 30 are joined by thermocompression bonding, for example. In further detail, through thermocompression bonding, specifically, the application of temperature and pressure such that the eutectic material melts, the eutectic bonding layer (AuSn layer) and adhesion layer (NiAu) layer of the conductive substrate 30 and element structure 20 form a new bonding layer (AuSnNi) 35, bonding the element structure 20 and the conductive substrate 30. In specific terms, bonding is performed by opposing and adhering the adhesion or bonding layer on the element structure 20 side and the eutectic bonding layer on the conductive substrate 30 side, and holding under a nitrogen atmosphere for 10 minutes at 330° C., at pressure of approximately 1 MPa.

Provided that the bonding material, the atmosphere during bonding, the bonding temperature, and the bonding time are sufficient to bring about melting of the eutectic material used without bringing about changes in the characteristics thereof (for example, deterioration in bonding strength due to oxidation), and bonding of the element structure 20 and the conductive substrate 30, there is no limitation to the material, the atmosphere, the temperature, and the time given above.

[Removal of Growth Substrate]

After the element structure 20 and the conductive substrate 30 have been joined, the GaAs growth substrate 10A is removed. By removing the GaAs growth substrate 10A, the surface of the n-clad layer 12 is exposed to give a light-extraction surface. Here, removal is effected through wet etching employing an etchant mixture of ammonia and hydrogen peroxide. However, removal of the GaAs growth substrate 10A is not limited to wet etching, and may be performed instead by dry etching, mechanical polishing methods, chemical mechanical polishing methods (CMP), or some combination thereof including at least one method.

[Formation of Light-Extraction Surface]

Next, projections/depressions structure (having photonic crystals) is formed on the surface of the n-clad layer 12 in order to improve the light-extraction efficiency. Firstly, by method such as photolithography, EB lithography, EB writing, nano implantation, laser exposure, or the like, together with a lift-off method, a mask pattern with an artificial periodic structure is formed on the n-clad layer 12. Next, etching is performed through dry etching, to form on the surface of the n-clad layer 12 light-extraction structure of projections of round conical shape or round pillar shape, and depressions. In the present embodiment, because grooves have been formed into the n-clad layer 12 (layer thickness 4.0 μm) to a depth of 2.0 μm from the p side at this time, it is preferable to form the light-extraction structure in the remaining 2.0 μm.

In specific terms, the light-extraction structure is formed by photonic crystals of round conical shape in a triangular lattice array having periodicity of 500 nm, height of 600 nm, and an aspect ratio of 1.2. The configuration of the photonic crystals may have periodicity in a range of 200 nm to 2000 nm, and an aspect ratio in the range of 0.7 to 1.5.

In lieu of photonic crystals, the light-extraction surface may be roughened by a method such as wet etching, to form the light-extraction structure. Furthermore, in the aforedescribed step, employing $SiO_2$ for example, a protective mask may be provided, as appropriate, in regions where the electrodes are to be formed on the light-extraction surface side, discussed below.

[Formation of Through-Holes]

Next, via holes (through-holes) 12G that reach from the surface (exposed surface) of the n-clad layer 12 (which is the light-extraction surface) to the n-electrodes 21 are formed by photolithography and dry etching of the surface of the n-clad layer 12. Then, the connection electrodes 23 connected to the n-electrodes 21 are formed in the through-holes 12G, and the connection electrodes 23 are electrically connected to the pad electrode 27 for wire-bonding purposes. During performing dry etching, due to a large difference in the etching rate between the semiconductor and the n-ohmic electrode metal, etching can easily be halted at the surface of the n-electrodes 21.

Next, the pad electrode 27, which performs electrical connection to the outside and electrically connects the n-electrodes 21 and the connection electrodes 23, is formed of Au to a thickness of 1.5 μm on the surface of the n-clad layer 12.

Figure 4:
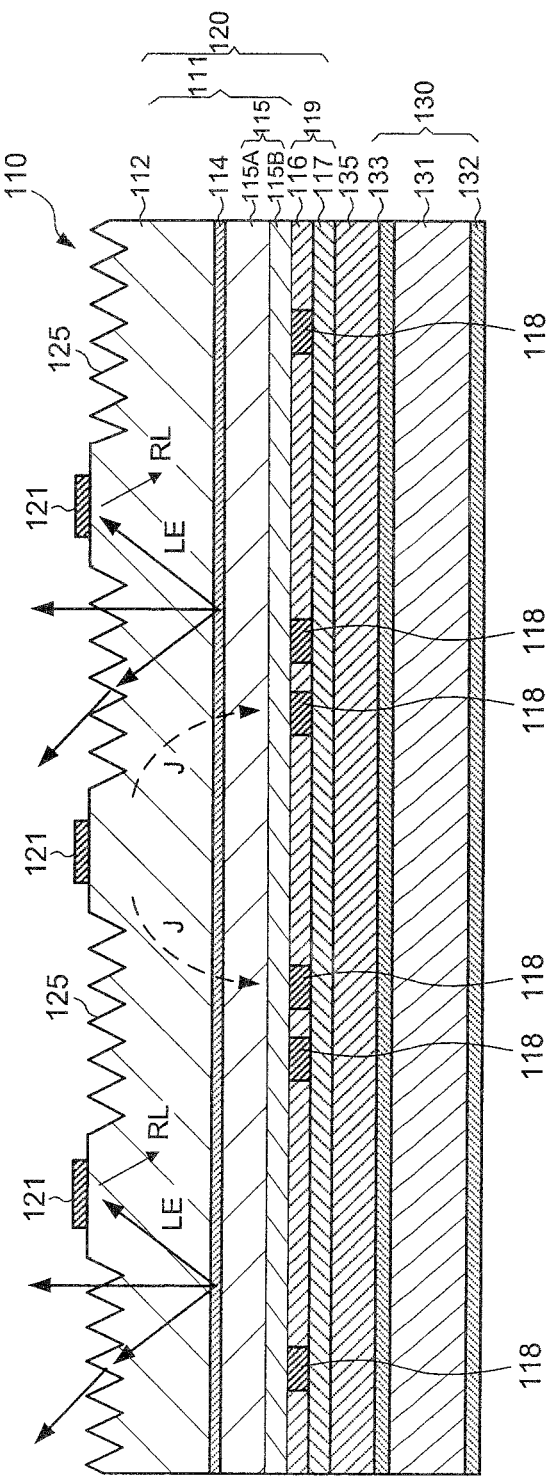
FIG. 4 is a sectional view schematically showing the light-emitting device of a comparative example to the first embodiment.

FIG. 4 shows a schematic sectional view of the light-emitting device 110 of a comparative example to the first embodiment. In the light-emitting device 110, a reflecting layer 119 and a semiconductor structure layer 111 are provided on a support substrate 131, with a bonding layer 135 therebetween; but in contrast to the first embodiment, the device is not provided with grooves that reach the first semiconductor layer 112, which is the semiconductor layer on the light-extraction surface side of the light-emitting layer 114. Accordingly, the ohmic electrodes 121 for the first semiconductor layer 112 are provided on the light-extraction surface. A second semiconductor layer 115 comprises a clad layer 115A and a contact layer 115B, and ohmic electrodes 118 are provided for ohmic contact with second semiconductor layer 115 (the contact layer 115B). Accordingly, the light-emitting layer 114 opposing the ohmic electrodes 121 is situated below the ohmic electrodes 121 of the first semiconductor layer 112. Moreover, in contrast to the first embodiment, through-holes are not needed, and the ohmic electrodes 121 are connected to a pad electrode provided on the first semiconductor layer 112. Other features are similar to the first embodiment. Specifically, an area excluding the ohmic electrode 121 formation portions is provided with the light-extraction structure 125, and a pad electrode having the so-called counter electrode configuration as described previously is provided for the purpose of electrical connection to the outside. Except for the feature of providing the ohmic electrodes 121 on the surface of the first semiconductor layer 112 (i.e., not within the first semiconductor layer 112), the electrode configuration, i.e., the electrode disposition, electrode length/width, and so on, in top view seen from a direction perpendicular to the first semiconductor layer 112, which is the light-extraction surface, is similar to that of the first embodiment.

As shown in FIG. 4, in the light-emitting device 110 of the comparative example, the ohmic electrodes 121 are provided in opposition to the light-emitting layer 114 from above the light-emitting layer 114, i.e., from the light-extraction surface side thereof, and therefore a portion of the light emitted from the light-emitting layer 114 (arrows LE) is blocked by the ohmic electrodes 121. A portion of the blocked light is absorbed by the electrodes. While a portion of the light is reflected from the back side of the electrodes (shown by arrows RL), re-reflection is necessary before the light again reaches the light-extraction surface, thus giving rise to reflection loss, as well as to absorption by the semiconductor layer due to the increased length of the optical path to again reach the light-extraction surface. Therefore, there is considerable loss of the light blocked by the electrodes, and there is a considerable reduction in light-extraction efficiency from the semiconductor structure layer 111.

On the other hand, as shown in FIG. 1, in the light-emitting device (LED) 10 of the first embodiment, no electrodes are situated at positions opposing the light-emitting layer 14 to the light-extraction surface side of the light-emitting layer 14, and therefore blockage of the emitted light from the light-emitting layer 14 is prevented, there is no loss due to the electrodes, and the light output of the light-emitting device (LED) is improved. The present invention is particularly effective in cases of larger electrode width, for obtaining a higher light-output LED.

In more specific terms, in the case of a counter electrode configuration, ordinarily, the coverage of the electrode with respect to the element surface area (i.e., light-emission surface area) in a conventional device is 5 to 15%, with light being blocked, and light output diminished, by a corresponding extent. According to the present invention, loss of light output due to light blockage by electrodes can be avoided, and therefore the light-extraction efficiency can be improved. Moreover, there can be provided a semiconductor light-emitting device having a low level of carrier overflow, high light-emission efficiency, and high linearity of light output, that is moreover highly reliable, with less deterioration.

Particular in the case of LEDs that employ AlGaAs or AlGaInP materials, in order to form ohmic electrodes, it is necessary to form an alloy layer of the semiconductor layer and the metal of the ohmic electrodes. Because formation of an alloy layer greatly reduces the reflectance of the ohmic electrodes, the configuration of the present invention affords further advantages in such cases. Additionally, in the configuration of the present invention, no electrodes are situated in opposition to the light-emitting layer to the light-extraction surface side of the light-emitting layer. Therefore, where light-extraction structure is formed on the surface, the surface area for formation can be increased, whereby light-extraction efficiency can be further improved, and light output can be increased.

In FIGS. 1 and 4, the paths of current (flows of electrons) J in the first embodiment and the comparative example, respectively, are shown schematically by broken arrows. In the configuration of the first embodiment, the grooves have been formed to penetrate through the light-emitting layer, but owing to the counter disposition configuration of the ohmic electrodes of the first semiconductor layer and the ohmic electrodes of the second semiconductor layer, the light output of the LED can be improved where the grooves are constituted within appropriate ranges, while maintaining current spread better than that in the case of the comparative example.

In further detail, as compared with the case of the comparative example, in which the ohmic electrodes were constituted on the light-extraction surface, there is a concern of reducing the effective film thickness of the semiconductor layer on the light-extraction surface side (the first semiconductor layer 12), possibly causing a rise in the forward voltage. However, it is amply possible to prevent a rise in the forward voltage, by increasing the depth of the grooves formed in the first semiconductor layer. Alternatively, a rise in the forward voltage, a drop in current spread, and the like can be prevented through appropriate design of the layer thickness of the first semiconductor layer, the carrier concentration, and so on. Specifically, the groove depth in the first semiconductor layer is preferably 0.5 μm or greater, more preferably 1.0 μm or greater. In cases in which light-extraction structure is formed, it will be necessary to leave enough thickness for forming the light-extraction structure. Moreover, while narrower width of the grooves is advantageous in that the removed regions of the light-emitting layer are smaller, the width should be sufficient to accommodate the disposition and wiring of the ohmic electrodes of the first semiconductor layer, for example, 1.0 μm or greater, and preferably 3 μm or greater.

In the light-emitting device 10 according to the first embodiment, the grooves 11G are formed as hollow spaces, but a configuration in which the grooves 11G are filled with metal or the like is also possible. For example, the grooves 11G can be filled by forming a bonding layer comprising AuSn on the reflecting metal layer 17 as well, and bonding this to a support.

Second Embodiment

Figure 5:
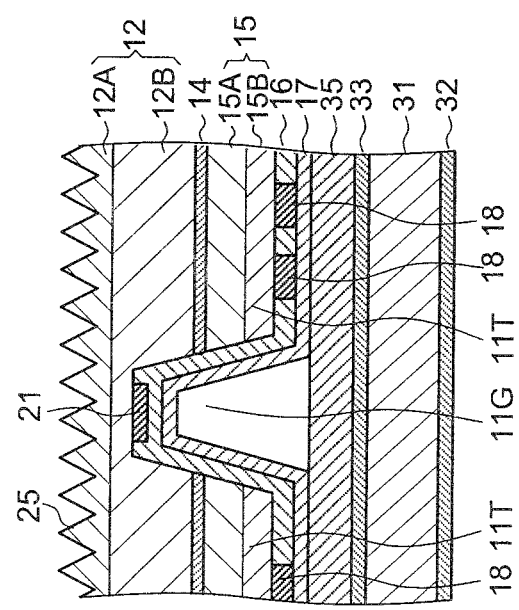
FIG. 5 is a partly sectional view schematically showing part of the cross section of the light-emitting device (LED) according to a second embodiment of the present invention.

FIG. 5 is a partly sectional view schematically showing part of the cross section of the light-emitting device (LED) 10 according to a second embodiment of the invention. The present embodiment differs from the LED 10 of the first embodiment in that the first semiconductor layer is constituted from an undoped layer 12A and an n-clad layer 12B.

In further detail, the undoped layer 12A of 0.5 μm layer thickness, and the high-concentration n-clad layer 12B of 3.5 μm layer thickness and a carrier concentration of $2 \times 10^{18}$ $cm^{-3}$, are grown on a growth substrate; and further, in a manner similar or analogous to the first embodiment, a light-emitting layer 14 0.5 μm in thickness, a p-clad layer 15A 1.0 μm in thickness of the composition $(Al_zGa_{1-z})_{0.5}In_{0.5}P$, and a p-contact layer 15B 1.5 μm in thickness of the composition $Ga_{1-x}In_xP$ (x=0.1), are epitaxially grown in succession to form a semiconductor structure layer 11. Next, the growth substrate is removed to expose the undoped layer 12A, which serves as the light-extraction surface. A light-extraction structure 25 (i.e., recesses/projections structure of photonic crystals) for improving the light-extraction efficiency is then formed on the exposed surface of the undoped layer 12A. The light-extraction structure 25 is formed to a depth such that they do not reach down to the n-clad layer 12B.

In the second embodiment, the grooves 11G are formed to a depth of 2.0 μm in the first semiconductor layer 12 (having a layer thickness 4.0 μm). More specifically, the depth of the n-clad layer 12B is 2.0 μm, versus the 3.5 μm thickness of the n-clad layer 12B. Then, in a similar manner to the first embodiment, n-electrodes 21, which are ohmic electrodes for the n-clad layer 12B, are formed at the bottom of the grooves 11G.

According to the second embodiment, the first semiconductor layer 12 is constituted, from the light-extraction side, by the undoped layer 12A and the n-clad layer 12B, with the n-electrodes 21 serving as ohmic electrode being formed in the n-clad layer 12B. However, there is no limitation to an undoped layer 12A on which doping has intentionally not been performed, and it would be possible to instead employ an n-layer of lower carrier concentration than the n-clad layer 12B. Stated another way, the semiconductor layer (i.e., first semiconductor layer) to the light-extraction surface side of the light-emitting layer is given a stacked or layered structure (in the second embodiment, a two-layer structure), adopting a configuration in which the semiconductor layer at outermost surface on the light-extraction surface side has a carrier concentration lower than the carrier concentration of the other semiconductor layer.

Specifically, in the structure of the aforedescribed comparative example, the ohmic electrodes are formed on the light-extraction surface, and therefore, in order to obtain low-resistance ohmic contact, it is necessary for the semiconductor layer at the outermost surface on the light-extraction surface side to be a layer that has been doped to a high concentration (for example, to a carrier concentration of $1 \times 10^{18}$ $cm^{-3}$ or greater). However, a high-concentration layer for the purpose of ohmic contact gives rise to considerable light absorption due to free carriers, a possible cause of diminished light output of the LED. In particular, in a case in which light-extraction structure has been formed on the surface, light impinging on the light-extraction structure is scattered, diffracted, and reflected by the light-extraction structure, and therefore absorption by the light-extraction structure would result in considerable loss before the light is extracted.

The following Table 1 shows a comparison of the light output and forward voltage (Vf) of the LEDs of the first embodiment and the second embodiment, and the LED of the aforedescribed comparative example. The values have been normalized, assigning values of 1.0 to the light output and forward voltage (Vf) of the LED of the comparative example.

TABLE 1

Light output and forward voltage (Vf)

|  | First Embodiment | Second Embodiment | Comparative Example |
|---|---|---|---|
| Light output | 1.12 | 1.18 | 1.00 |
| Forward voltage (Vf) | 1.03 | 1.03 | 1.00 |

As shown in Table 1, it was verified that the light output is improved by 10% or more where the n-clad layer is constituted by a single layer of high carrier concentration (i.e., the first embodiment), and improved by 18% where the n-clad layer is constituted by a high-carrier concentration layer and an undoped layer (i.e., the second embodiment). This is due to the fact that the configuration of the present invention overcomes the disadvantage of light blocking by the n-ohmic electrodes (the first and second embodiments), plus the effect of constituting the light-extraction structure region from a layer having minimal absorption (second embodiment).

The rise in the forward voltage does not exceed 3% in comparison with the LED of the comparative example, which is understood to mean that substantially the same current spread was obtained. In particular, even in a case of a layered structure in which an undoped layer is added to n-clad layer, it was found that the light output could be further improved, without any rise in the forward voltage.

As described above, in the case of the second embodiment, grooves are formed from the reflecting surface side, forming the ohmic electrodes for the semiconductor layer to the light-extraction surface side from the light-emitting layer therein, therefore making it unnecessary to form a high-carrier concentration layer at the outermost surface (at the light-extraction surface). In particular, the semiconductor layer at the outermost surface (the lower-carrier concentration layer) preferably has a carrier concentration of $5 \times 10^{17}$ cm$^{-3}$ or less, and more preferably is a semiconductor layer on which doping has intentionally not been performed (or an undoped semiconductor layer). Absorption by free carriers is minimized with this configuration, so that the output of the LED can be improved.

Third Embodiment

A GaN light-emitting diode (LED) 10 according to a third embodiment of the invention is described below, with reference to FIGS. 1 and 3. Referring to FIG. 3, the semiconductor structure layer of the third embodiment includes an n-type GaN clad layer (first semiconductor layer) 12 of 5.0 μm thickness, a light-emitting layer 14 of 75 nm thickness, and a second semiconductor layer 15 comprising a p-type Al$_{0.2}$Ga$_{0.2}$N layer 15A of 40 nm thickness and a p-type GaN clad layer 15B of 100 nm thickness. The n-type GaN clad layer 12, the light-emitting layer 14, the p-type Al$_{0.2}$Ga$_{0.2}$N layer 15A and the p-type GaN clad layer 15B have been epitaxially grown by MOCVD in this order on a (0001) plane of a sapphire substrate 10A.

The multiple quantum well structure is constituted from 5 pairs of well layers and barrier layers, employing well layers of the composition In$_x$Ga$_{1-x}$N (x=0.35) 2 nm thick, and GaN barrier layers 14 nm thick. The In composition x of the well layers is adjusted within the range 0≤x≤1.0, according to the light-emission wavelength.

Next, the grooves 11G is formed by photolithography and dry etching. Forming of the grooves 11G involves dry etching to penetrate through (i.e., remove) the second semiconductor layer 15 (the p-type Al$_{0.2}$Ga$_{0.2}$N layer and p-type GaN clad layer) and the light-emitting layer 14, and to remove portions of the n-clad layer 12, forming grooves that reach into the n-clad layer 12. The etching depth in the n-clad layer 12 is 2.0 μm versus the 5.0 μm layer thickness of the n-clad layer 12, forming the grooves 11G to a total etching amount of 2.2 μm. Typically, in the case of a GaN material, the layer thickness of the p-clad layer and the light-emitting layer will be 300 nm or less, and therefore the groove depth is shallower as compared with AlGaIn (AlGaAs) materials, making it easier to form the grooves.

The width of the grooves 11G is 20 μm, versus the 15 μm width of the n-electrodes 21. The width of the grooves 11G is preferably small, because a narrower width means a smaller amount of etching of the light-emitting layer 14. Since, GaN is a high-power type material in comparison with AlGaInP, the electrode width is triple, while the groove etching depth is one-half; accordingly, the margin for groove width was smaller.

The n-ohmic electrodes 21 are formed at the bottom of the grooves 11G formation portions. The n-ohmic electrodes 21 are formed by deposition of metal from the p-clad layer side. Here, a Ti/Al/Au layer (layer thickness: 1 nm/200 nm/1000 nm) material was employed for the material that can form ohmic contact with an n-type semiconductor.

Next, an insulating layer 16 is formed for the purpose of insulating the semiconductor layer junction, and insulating the n-ohmic electrodes 21. The insulating layer 16 is made from SiO$_2$ that is 310 nm thick. The insulating layer 16 is not limited to SiO$_2$; SiN, TiO$_2$, Al$_2$O$_3$, or the like can be used as well.

This SiO$_2$ layer together with a subsequent metal layer 17 serves as a reflecting layer. Therefore, the film thickness d of the SiO$_2$ layer, with respect to the light emission wavelength λ0 in a vacuum, is constituted as d=λ0/(4n)×m (where n is the refractive index of SiO$_2$, and m is an integer). Here, λ0=450 nm, n=1.45, and m=4.0, so a value of d=310 nm is employed.

Firstly, openings of desired shape are formed in the SiO$_2$ of the insulating layer 16 by photolithography and etching employing buffered hydrofluoric acid (BHF). Thereafter, the reflecting surface-side electrodes, which are p-ohmic electrodes 18, are formed. For the p-ohmic electrodes 18, an indium tin oxide (ITO) layer, and then an Ag layer, are formed on a p-type GaN layer. Of the light emitted from the light-emitting layer 14, the light that is traveling towards the opposite side from the light-extraction side is reflected by a reflecting layer constituted by the ITO layer and the Ag layer, thus improving the light-extraction efficiency. The ITO layer (layer thickness: 10 nm) and the Ag layer (layer thickness: 310 nm) are deposited employing, for example, sputtering, EB, or the like.

Next, 300 nm of Ag is formed as the reflecting metal layer 17. The reflecting metal layer 17 can be any material having high reflectance of light from the active layer, such as Al, Rh, or the like. The reflecting metal layer 17 and the SiO$_2$ insulating layer 16 constitute a reflecting layer 19. Of the light exiting from the light-emitting layer 14, light that is traveling towards the opposite side from the light-extraction side is reflected by the reflecting layer 19, thus improving the light-extraction efficiency. Next, a barrier layer (not illustrated) is formed over the reflecting metal layer 17. A 200 nm Ti layer and a 100 nm Pt layer were formed as a barrier layer to prevent diffusion of the Ag.

Thereafter, bonding to the support body 30, removal of the growth substrate 10A, formation of the light-extraction structure 25, formation of the through-holes and connection electrodes 23, and formation of the pad electrode 27 are performed in a manner similar to the first embodiment. Removal of the sapphire growth substrate 10A is carried out by a laser lift-off method.

In the GaN light-emitting diode (LED) of the aforementioned configuration, in a manner similar to the case of the first embodiment, there is no blockage of light from the light-emitting layer by the first semiconductor layer, and therefore the light output can be improved. Also, in a manner similar to the case of the first embodiment, there is no decrease of current spread or rise of forward voltage. Moreover, in a manner similar to the case of the second embodiment, the first semiconductor layer is constituted by a stacked structure of a high-carrier concentration layer and a low-carrier concentration layer (or an undoped layer), giving a low carrier concentration to the semiconductor layer on the light-extraction surface side, thereby suppressing absorption by free carriers, and further improving the light output of the LED.

Typically, for a GaN LED grown on a sapphire substrate, in order to reduce crystal defects arising from the difference in lattice constant between the substrate and the growing crystal, prior to formation of the light-emitting layer, the GaN layer is grown to a thickness, for example, of 3.0 µm or greater, preferably 5.0 µm or greater, to improve crystallinity.

In the case of an LED having a metal bonding (MB) structure, it will be necessary for the n-side electrodes to lead out from the surface from which the sapphire substrate has been removed. Consequently, to constitute the semiconductor layer, it will be necessary for the n-type GaN layer on which n-doping (for example, Si-doping) has been performed to be grown to a layer thickness of 3.0 µm or greater, preferably 5.0 µm or greater. However, in comparison with undoped GaN, doped n-type GaN has lower crystallinity, as well as larger surface asperities or roughness, possibly lowering element characteristics such as the light-emission efficiency. Consequently, according to the present embodiment, because a doped (for example, an Si-doped) n-type GaN layer can be formed on an undoped GaN layer of good crystallinity, the crystallinity of the first semiconductor layer overall can be improved in comparison with the case where the entire layer is doped; and absorption by free carriers is eliminated, whereby the element characteristics, such as the light-emission efficiency, of the LED can be improved. Moreover, while an undoped GaN layer is preferred, even when a low-carrier concentration GaN is employed instead of an undoped GaN layer, the effect of improved crystallinity is achieved, and therefore the element characteristics can be improved.

As described in detail above, according to the present invention, there can be provided a semiconductor light-emitting device having improved light-extraction efficiency, high light-emission efficiency, and high linearity of light output, and that is moreover highly reliable, with less deterioration.

Fourth Embodiment

Figure 6A:
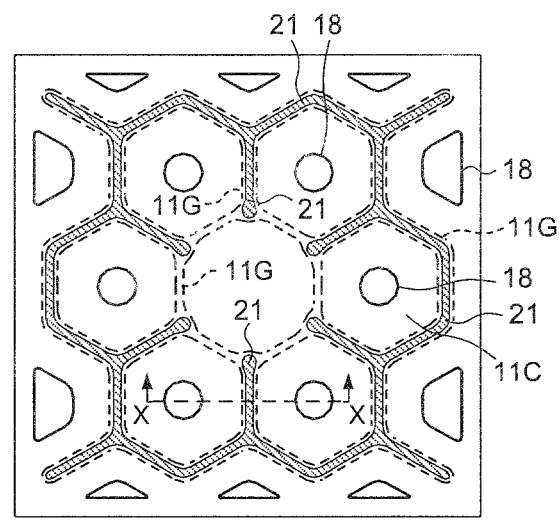
FIGS. 6A, 6B, and 6C are plan views schematically showing the electrode configuration of the light-emitting device according to a fourth embodiment of the invention.
Figure 6B:
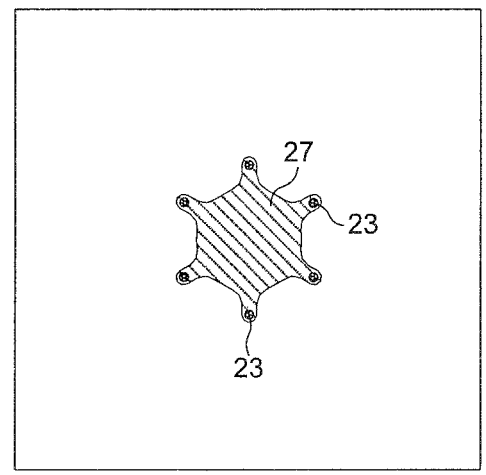
Figure 6C:
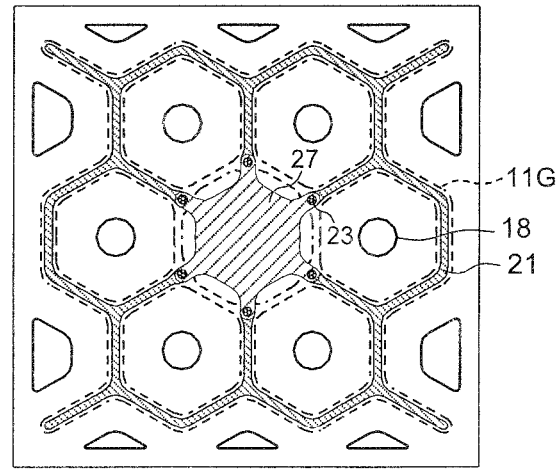

FIGS. 6A, 6B, and 6C are drawings similar to FIGS. 2A, 2B, and 2C, i.e., plan views schematically showing the electrode configuration of the light-emitting device (LED) 10 according to a fourth embodiment. In further detail, FIG. 6A schematically shows the electrode configuration where the p-electrodes 18 and the n-electrodes 21 of the LED 10 are projected onto a plane parallel to the crystal growth surface (or the semiconductor structure layer).

As shown in FIG. 6A, in the light-emitting device (LED) 10 of the fourth embodiment, the grooves 11G formed in the semiconductor structure layer 11 have a honeycomb shape in the plane of the semiconductor structure layer 11. The configuration and method of production of the semiconductor structure layer 11 are the same as in the aforedescribed first embodiment. In a manner similar to the aforedescribed first to third embodiments, the grooves 11G penetrate through the light-emitting layer (active layer) 14 from the second semiconductor layer 15, to reach the first semiconductor layer.

In further detail, the grooves 11G are formed as grooves of a honeycomb structure in which the semiconductor structure layer 11 is partitioned by grooves having regular hexagonal shape in a plane parallel to the semiconductor structure layer 11. Stated another way, it has a structure filled with light-emitting portions (hereinafter also called "cells") 11C of regular hexagonal shape partitioned by the grooves of regular hexagonal shape. Specifically, the semiconductor structure layer 11 is divided into the plurality of light-emitting portions (cells) 11C by grooves forming the closed loops of the honeycomb structure.

Figure 7:
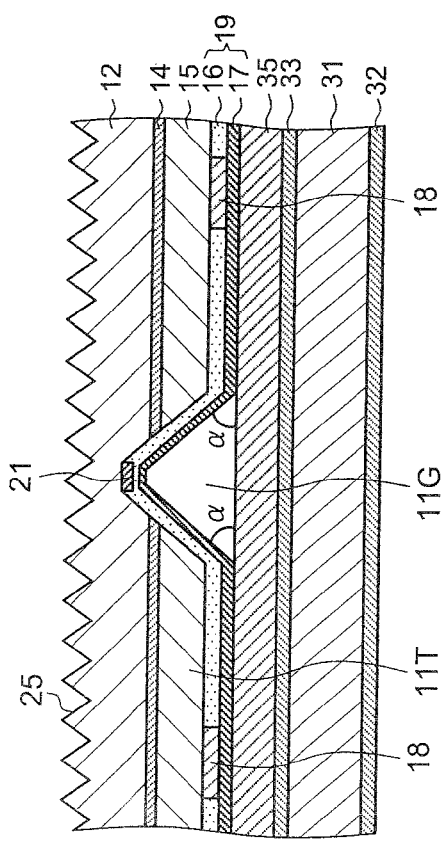
FIG. 7 is an enlarged sectional view showing a part taken along line X-X in FIG. 6A.

Apart from the configuration of the grooves 11G, the configuration can be similar to that of the first to third embodiments. FIG. 7 is an enlarged sectional view showing part of the LED 10 of FIG. 6A, taken along line X-X. Specifically, the semiconductor structure layer 11 comprises a first semiconductor layer 12 of a first conduction type, a light-emitting layer (active layer) 14, and a second semiconductor layer of a second conduction type which is the opposite conduction type from the first conduction type. A case in which the first semiconductor layer 12 is an n-clad layer and the second semiconductor layer 15 is a p-clad layer is described. However, in a manner similar to the first embodiment, the second semiconductor layer 15 may be constituted, for example, of a p-clad layer 15A and a contact layer 15B. Moreover, in a manner similar to the second embodiment, the first semiconductor layer 12 may be constituted, for example, of an undoped layer 12A and an n-clad layer 12B.

As shown in FIG. 7, the grooves 11G are formed so as to penetrate through the light-emitting layer 14 and reach the first semiconductor layer 12 from the second semiconductor layer 15. The surface of the semiconductor structure layer 11 exposed through the grooves 11G (i.e., the end surface of the semiconductor structure layer 11) is covered by an insulating layer 16 and a metal layer 17. In a manner similar to the aforedescribed embodiments, the insulating layer 16 and the metal layer 17 constitute a reflecting layer 19.

As shown in FIG. 7 and FIG. 6A, the LED 10 is further provided with p-electrodes 18 and n-electrodes 21. The p-electrodes 18 form ohmic contact with the second semiconductor layer 15, and are electrically connected to the metal layer 17. The n-electrodes 21 are provided at the bottom of the grooves 11G, and form ohmic contact with the first semiconductor layer 12. Through-holes are provided reaching from the surface of the first semiconductor layer 12 to the n-electrodes 21; and connection electrodes 23 which reach from the surface of the first semiconductor layer 12 to the n-electrodes 21 and which are connected to the n-electrodes 21 are formed in the through-holes. The connection electrodes 23 are provided, for example, at positions corresponding to the vertices of the grooves 11G of regular hexagonal shape in the center part of the LED 10 (FIG. 6B, 6C). An n-pad electrode 27 connected to the individual connection electrodes 23 is formed as a Schottky electrode on the first semiconductor layer 12.

In the fourth embodiment, the light-extraction efficiency at which internally propagated light is extracted to the outside is increased by extending the length of the end surfaces of the semiconductor structure layer 11 that are formed by the grooves 11G is exposed (i.e., the length of the side surfaces where the light-emitting layer 14 are exposed), to one greater than the length of the outer perimeter of the light-emitting device 10. Specifically, by expanding the length of the groove 11G formation regions in the plane of the semiconductor structure layer 11 (or the light-emitting layer), the light propagated through the interior of the semiconductor layers undergoes a change in propagation direction due to reflection by the end surfaces of the semiconductor layer, and the light-extraction efficiency of the light-emitting device 10 can be increased. In particular, among the layers constituting the semiconductor structure layer 11, the light-emitting layer 14 has higher refractive index as compared with the n-type and p-type semiconductor layers (clad layers), and thus has more internally propagated light. Therefore, increasing the number of end surfaces of the light-emitting layer 14 is an important factor in terms of increasing the light-extraction efficiency.

With the configuration of the grooves 11G in the present embodiment, increasing the length of the groove 11G formation regions (specifically, the length of the grooves 11G that cut through the light-emitting layer 14) within the plane of the light-emitting layer 14 decreases the surface area of the light-emitting layer 14 is decreased. Therefore, by adopting a honeycomb structure, which affords the densest packing of the grooves 11G, it is possible for the groove 11G formation regions to be of maximum length, specifically, the side surfaces of the semiconductor layers, while minimizing the reduction in the surface area of the light-emitting layer 14. Moreover, by adopting a closed loop configuration in which the light-emitting portions (light-emitting cells) 11C in the honeycomb structure are separated from one another by regular hexagonal grooves, internally propagated light can be extracted to the outside more efficiently.

Table 2 below shows a comparison of relationships of the outer perimeter length L1, the end surface length L2 of the interior semiconductor layer (light-emitting layer), and the light output, for the LEDs of the first embodiment and the fourth embodiment, and the LED of the comparative example discussed earlier. The LEDs of the first and fourth embodiments and the comparative example have a square shape of 350 μm per side (i.e., an outer perimeter length of 1400 μm). The light outputs are shown when the light output of the LED of the comparative example is normalized to 1.0.

TABLE 2

End surface length and light output

| | Outer perimeter L1 | Interior end surface length L2 | (L1 + L2)/L1 | Light output |
|---|---|---|---|---|
| First embodiment | 1400 | 650 | 1.46 | 1.12 |
| Fourth embodiment | 1400 | 3100 | 3.21 | 1.20 |
| Comparative example | 1400 | 0 | 1.00 | 1.00 |

As shown in Table 2, in the LED of the fourth embodiment, the length of the end surfaces of the light-emitting layer (specifically, outer perimeter length L1+inner perimeter length L2) with respect to the outer perimeter length L1 is 3.21 times that of the LED of the comparative example, while the light output is 1.20 times that of the comparative example, so the light-extraction efficiency is evidently improved. Moreover, the light-extraction efficiency is evidently improved in comparison with the first embodiment (in which the light output is 1.12 times) as well.

While the case in which the grooves 11G have a honeycomb structure has been described, there is no limitation thereto. Specifically, provided that the grooves 11G are formed so as to partition the light-emitting layer and define a plurality of light-emitting portions separated from one another, the length of the end surfaces of the light-emitting layer can be increased. Consequently, the direction of propagation of light reflected by the end surfaces can be changed to the direction of the light-extraction surface, and the efficiency of light extraction can be increased. As the shape of the grooves 11G, there can be adopted a tesselated structure, for example, a regular triangular shape, a square shape, or the like. While a case in which the light-emitting portions (cells) 11C in the honeycomb structure constitute closed loops separated from one another by grooves of rectangular hexagonal shape (excluding the peripheral portion of the LED 10), there is no limitation thereto. The grooves 11G may constitute partially closed loops within the semiconductor structure layer 11.

Fifth Embodiment

Figure 8A:
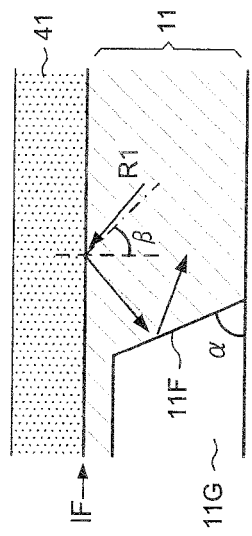
FIGS. 8A, 8B, and 8C are schematic enlarged sectional views showing the side surface of a groove 11G (i.e., end surface of the semiconductor structure layer) in a fifth embodiment of the invention.
Figure 8B:
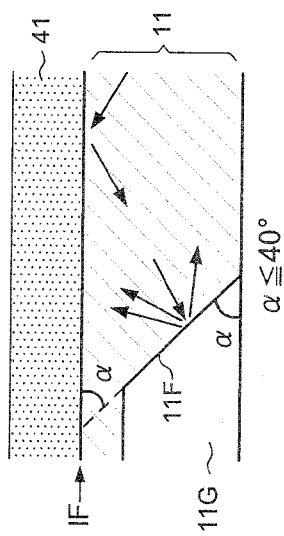
Figure 8C:
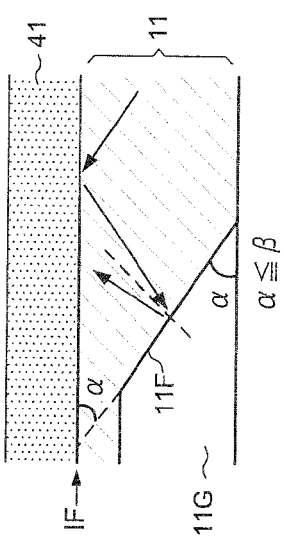

In a fifth embodiment, the angle α (FIG. 7) defined by the end surfaces of the semiconductor structure layer 11 which are formed by the grooves 11G (or the side surfaces of the grooves 11G) is adjusted so as to increase the light-extraction efficiency. The description of this feature will be made with reference to the drawings. FIGS. 8A, 8B, and 8C are schematic enlarged sectional views showing the side surface of a groove 11G of the LED 10 of the fifth embodiment. The configuration of the end surface of the semiconductor structure layer 11 (or, the side surface of the groove 11G) is primarily shown, with the detailed configuration of the semiconductor structure layer 11, as well as the insulating layer 16, the metal layer 17, the reflecting layer 19, and so on being omitted in order to facilitate description and understanding. Moreover, in order to facilitate description and understanding of the light ray path, a case in which no light-extraction structure has been formed on the surface of the first semiconductor layer (n-clad layer) 12 which is the light-extraction surface, the surface of the first semiconductor layer 12 being constituted as a flat light-extraction surface, is described. Specifically, a case in which the surface of the first semiconductor layer is a flat surface parallel to the crystal growth face (specifically, parallel to the light-emitting layer 14) is described.

In FIGS. 8A, 8B, and 8C, an external medium 41 of a refractive index of $n_{AMB}$ is shown on the semiconductor structure layer 11. In a case in which, for example, the external medium 41 has not been provided (specifically, when the surface of the semiconductor structure layer 11 is exposed to the air), the refractive index of $n=n_{AIR}$ (approximately 1.0). The example of a case in which the external medium 41 is a resin having a refractive index of $n_{AMB}$ (=1.5) is described below.

As shown in FIG. 8A, of the light emitted from the light-emitting layer of the semiconductor structure layer 11 and impinging on the surface of the first semiconductor layer 12 (i.e., the interface IF of the semiconductor structure layer 11 and the external medium 41), which is the light-extraction surface, a light component R1 of a critical angle β or greater is reflected rather than being extracted. The light reflected at the interface IF is reflected by an end surface 11F of the semiconductor structure layer 11. In a case in which the angle α of the end surface 11F (hereinafter, referred to as the slope angle) of the semiconductor structure layer 11 with respect to the semiconductor structure layer 11 (i.e., the surface of the first semiconductor layer 12) is large, an increasing amount of the internally propagated light is reflected towards the reflection layer side rather than towards the light-extraction surface side, which is undesirable. When a simulation was performed by a ray tracing method, assuming an isotropic radiation source RS within the semiconductor structure layer 11, and taking into account the solid angle of the radiated light, the following results were obtained. The grooves 11G are formed to a progressively tapering shape in which the opening area thereof becomes smaller towards the direction of the interior of the semiconductor structure layer 11 (i.e., the direction leading from the second semiconductor layer 15 towards the first semiconductor layer 12), the slope angle α being defined as 0<α<90°. Stated another way, the end surface of the semiconductor structure layer 11 formed by groove 11G (i.e., the side surface of the groove 11G) is sloped at an orientation such that emitted light from the end surface of the light-emitting layer 14 is reflected towards the light-extraction surface side by the reflecting layer 19.

As shown in FIG. 8B, the result of the simulation was that the condition under which 80% or more of the light reflected at the light-extraction surface (i.e., the interface IF) and impinging on the end surface 11F of the semiconductor structure layer 11 is reflected towards the light-extraction surface (the interface IF) side is a slope angle of the end surface 11F of 40° or less. Specifically, in cases in which the slope angle of the end surface 11F is 40° or less (a) 40°, irrespective of the semiconductor composition of the semiconductor structure layer 11, 80% or more of the light reflected by the interface IF and impinging on the end surface 11F is reflected towards the light-extraction surface (the interface IF) side. When the slope angle is 60° or greater, half of the light component impinging on the end surface 11F is reflected towards the reflecting surface side, rather than towards the light-extraction surface side.

As shown in FIG. 8C, in cases in which the slope angle α of the end surface 11F is equal to or less than the critical angle β (α≤β), all of the light reflected by the interface IF and impinging on the end surface 11F is reflected towards the light-extraction surface (the interface IF) side. When, for example, the refractive index $n_{AMB}$ of the external medium 41 is 1.5, the refractive index of a GaN semiconductor n(GaN) is 2.5 and the critical angle β is 37°, whereas in the case of an AlGaInP semiconductor, the refractive index n(AlGaInP) is 3.3 and the critical angle β is 27°.

By adjusting the slope angle α of the end surface 11F of the semiconductor structure layer 11 in the aforedescribed manner, light reflected from the light-extraction surface can be effectively extracted, and a light-emitting device of excellent light-extraction efficiency can be obtained. The present embodiment can be applied in any of the aforedescribed embodiments.

While a case in which the surface of the first semiconductor layer 12, which is the light-extraction surface, is flat rather than having light-extraction structure formed thereon, the above-described discussion holds when the light-extraction structure is formed. In this case as well, due to the end surface 11F, light reflected by the light-extraction structure and impinging on the end surface 11F of the semiconductor structure layer 11, as well as light impinging on the end surface 11F from within the semiconductor structure layer, is effectively reflected towards the light-extraction surface side, at high probability.

According to the present invention, as described in detail hereinabove, there can be provided a semiconductor light-emitting device having improved light-extraction efficiency, high light-emitting efficiency and high linearity of light output, and that is moreover highly reliable, with less deterioration.

The above-described embodiments can be combined, as appropriate, or applied in modified form. The aforedescribed materials, numerical values, and the like are merely exemplary.

This application is based on Japanese Patent Applications No. 2012-38146 and No. 2012-164824 which are hereby incorporated by reference.

What is claimed is:

1. A light-emitting device having a semiconductor structure layer in which there are sequentially stacked a first semiconductor layer, a light-emitting layer, and a second semiconductor layer of the opposite conduction type to the first semiconductor layer, a surface of said first semiconductor layer serving as a light-extraction surface, the light-emitting device having:
   a groove passing through said second semiconductor layer and said light-emitting layer from said second semiconductor layer side, to reach said first semiconductor layer;
   a first ohmic electrode formed so as to be in contact with said first semiconductor layer within said groove;
   a connection electrode passing through said first semiconductor layer from the surface of said first semiconductor layer, and electrically connected to a portion of said first ohmic electrode;
   an insulating layer for covering said second semiconductor layer on a surface thereof opposing said first semiconductor layer, the insulating layer having an opening through which an opposing surface is partially exposed;
   a second ohmic electrode formed so as to be in contact with said second semiconductor layer in said opening;
   a metal layer formed over said insulating layer, and connected to said second ohmic electrode; and
   a support bonded to said metal layer via a bonding layer.

2. The light-emitting device according to claim 1, wherein a mutually separated plurality of said grooves are formed, with said first ohmic electrode and said connection electrode being formed in each of said plurality of grooves to provide a plurality of first ohmic electrodes and a plurality of connection electrodes; and the surface of said first semiconductor layer is provided with a wiring electrode connected to said plurality of connection electrodes.

3. The light-emitting device according to claim 1, wherein said metal layer includes a light-reflecting metal layer formed over said insulation layer.

4. The light-emitting device according to claim 1, wherein said first ohmic electrodes are provided at the bottom of said grooves.

5. The light-emitting device according to claim 1, wherein said first semiconductor layer comprises a high-carrier concentration semiconductor layer having a higher carrier concentration formed over said light-emitting layer, and a low-carrier concentration semiconductor layer having a lower carrier concentration than said high-carrier concentration semiconductor layer, said first ohmic electrodes being formed so as to be in contact with said high-carrier concentration semiconductor layer.

6. The light-emitting device according to claim 5, wherein a light-extraction structure having recesses and projections is formed on the surface of said low-carrier concentration semiconductor layer, said light-extraction structure being formed to a depth such that said high-carrier concentration semiconductor layer is not reached.

7. The light-emitting device according to claim 5, wherein said low-carrier concentration semiconductor layer is an undoped layer.

8. The light-emitting device according to claim 5, wherein said low-carrier concentration semiconductor has a carrier concentration of $5 \times 10^{17}$ cm$^{-3}$ or lower.

9. The light-emitting device according to claim 5, wherein said semiconductor structure layer is a GaN-based light-emitting diode structure layer.

10. The light-emitting device according to claim 1, wherein said grooves are formed so as to partition said light-emitting layer, and define a mutually separated plurality of light-emitting portions.

11. The light-emitting device according to claim 10, wherein said grooves are grooves having a honeycomb structure in the plane of said semiconductor structure layer.

12. The light-emitting device according to claim 1, wherein said grooves are formed to a progressively tapering shape in which the area of the opening thereof decreases towards the interior of said semiconductor structure layer, the slope angle $\alpha$ ($0 < \alpha < 90°$) of the end surface formed by a said groove in said semiconductor structure layer being 40° or less, with respect to said semiconductor structure layer.

13. The light-emitting device according to claim 12, wherein said slope angle is an angle equal to or less than the critical angle at the interface of said first semiconductor layer and an external medium contacting said first semiconductor layer.

* * * * *